US006638819B1

(12) United States Patent
Joshi et al.

(10) Patent No.: US 6,638,819 B1
(45) Date of Patent: Oct. 28, 2003

(54) METHOD FOR FABRICATING INTERFACIAL OXIDE IN A TRANSISTOR AND RELATED STRUCTURE

(75) Inventors: Pankaj N. Joshi, Irvine, CA (US); Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 64 days.

(21) Appl. No.: 09/721,128

(22) Filed: Nov. 17, 2000

(51) Int. Cl.[7] .......................................... H01L 21/8242
(52) U.S. Cl. ..................... 438/256; 438/320; 438/758; 438/778; 438/787
(58) Field of Search ................................ 438/256, 320, 438/758, 778, 787

(56) References Cited

U.S. PATENT DOCUMENTS

| | | | |
|---|---|---|---|
| 4,503,807 A | 3/1985 | Nakayama et al. | 118/719 |
| 4,650,698 A | 3/1987 | Moriya et al. | 427/237 |
| 4,956,204 A | 9/1990 | Amazawa et al. | 427/248.1 |
| 6,287,903 B1 * | 9/2001 | Okuno et al. | 438/197 |
| 6,365,479 B1 * | 4/2002 | U'Ren | 438/320 |
| 6,410,395 B1 * | 6/2002 | Terpstra et al. | 438/312 |
| 6,410,975 B1 * | 6/2002 | Racanelli | 257/591 |
| 6,459,104 B1 * | 10/2002 | Schuegraf | 257/197 |

* cited by examiner

*Primary Examiner*—Richard Elms
*Assistant Examiner*—Pho Luu
(74) *Attorney, Agent, or Firm*—Farjami & Farjami LLP

(57) ABSTRACT

A gas is supplied at a certain partial pressure for a chemical reaction with a top surface of a base in a transistor. The top surface of the base is heated to a certain temperature to promote the chemical reaction. For example, the gas can be oxygen, the base can be an epitaxial single crystal silicon-germanium base of a heterojunction bipolar transistor ("HBT"), and the chemical reaction can be oxidation of the silicon in the top surface of the silicon-germanium base. The partial pressure of oxygen is maintained at 0.1 atmosphere and the top surface of the base is heated using rapid thermal processing ("RTP") to a temperature of 500° C. The chemical reaction forms a dielectric layer on the top surface of the base. For example, using oxygen as stated above, a dielectric layer of silicon oxide ("interfacial oxide") is formed. Controlling the thickness and density of the interfacial oxide causes the gain of the transistor to be as desired. For example, using oxygen in the silicon-germanium HBT at 0.1 atmosphere partial pressure, and RTP to heat the top surface of the base of the HBT to 500 C., an interfacial oxide is formed with thickness approximately 9.0 to 13.0 Angstroms and area density in a range of approximately $1*10^{15}$ to $4*10^{15}$ atoms per square centimeter, which causes the gain of the HBT to be the desired value of approximately 100.0.

29 Claims, 5 Drawing Sheets

METHOD FOR FABRICATING INTERFACIAL OXIDE IN A TRANSISTOR AND RELATED STRUCTURE

BACKGROUND OF THE INVENTION

1. Field of the Invention

The present invention relates to the field of fabrication of semiconductor devices. More specifically, the invention relates to the fabrication of transistors and, in particular, fabrication of silicon-germanium transistors.

2. Related Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. More technically, the current gain approaches a value of one as the frequency of operation of the transistor approaches the cutoff frequency. Cutoff frequencies in excess of 100 GHz have been achieved for the HBT, which are comparable to the more expensive GaAs. Previously, silicon-only devices have not been competitive for use where very high speed and frequency response are required.

The higher gain, speeds, and frequency response of the HBT have been achieved as a result of certain advantages of silicon-germanium not available with pure silicon, for example, narrower band gap, and reduced resistivity. Silicon-germanium may be epitaxially grown on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

A polycrystalline silicon emitter can be formed above the epitaxially grown single crystal silicon-germanium base. There are several possible methods of forming a polycrystalline silicon emitter. For example, one approach is to form a layer of some material which can be selectively etched relative to the single crystal silicon-germanium base and open a "window" in that material in which to deposit the polycrystalline silicon for the emitter. After the polycrystalline silicon is deposited for the emitter, the excess material is etched away selectively to the silicon-germanium base, forming the polycrystalline silicon emitter above the single crystal silicon-germanium base.

Prior to formation of the emitter, there is typically a thin layer of silicon oxide that is grown on the surface of the silicon-germanium base. This thin layer of silicon oxide is generally desirable to remain on the surface of the base. For example, if this thin layer of silicon oxide is completely removed from the surface of the base and the silicon for the emitter is deposited directly on top of the single crystal base, the silicon aligns with the underlying crystal structure and a single crystal epitaxial emitter is formed rather than the desired polycrystalline emitter. Furthermore, the resulting bipolar transistor has unacceptably low gain. Gain, simply stated, is the ratio of collector current, $I_c$, divided by base current, $I_b$, i.e. gain equals $I_c/I_b$.

As stated above, by forming a thin silicon oxide layer on top of the single crystal base before depositing silicon for the emitter, the desired polycrystalline emitter is formed. Because the thin silicon oxide layer is formed at the interface between the single crystal base and the polycrystalline emitter, it is also referred to as "interfacial oxide." The interfacial oxide has the effect of increasing the gain of the bipolar transistor. The interfacial oxide across the emitter opposes the flow of minority carriers so that the base current in one direction is reduced, while the collector current is largely unaffected. Therefore, $I_c/I_b$, which is the gain of the bipolar transistor, is increased.

In general, making the interfacial oxide layer thicker increases the gain of the bipolar transistor, and conversely, making the interfacial oxide layer thinner decreases the gain. As remarked above, if no interfacial oxide is formed, the gain is unacceptably low. An interfacial oxide layer that is too thick increases the gain but adversely affects the cutoff frequency, causing the cutoff frequency to be too low. For the silicon-germanium HBT, an optimum gain is approximately 100.0. Therefore, it is desirable to fabricate a silicon-germanium HBT with the thickness of the interfacial oxide in an optimum range, neither too low nor too high, such that the gain of the HBT is approximately 100.0.

Other attributes, besides thickness, of the interfacial dielectric that affect gain of the bipolar transistor are the composition of the interfacial dielectric, and its density. For example, in the silicon-germanium HBT, the composition is silicon oxide. Other dielectric materials could be used, for example, silicon oxynitride. Density can be measured by secondary ion mass spectrometry ("SIMS"). For example, with interfacial oxide, a sample of the interfacial oxide is bombarded with ions to remove ions from the sample. The ions are counted to determine the atomic density of the interfacial oxide. The density is measured as "area density" in units of atoms per square centimeter. In general, there is a trade-off between thickness and area density of the interfacial oxide with respect to the gain of the bipolar transistor. If a technique for forming the interfacial oxide produces a lower density oxide, the oxide must be made thicker to achieve the same gain as the gain achieved by an interfacial oxide that is thinner and higher density. Moreover, lower density oxide is more prone to cause epitaxial re-alignment of the polycrystalline emitter. Because of this, it is not desirable to form very low-density oxides. Thus, by altering the composition, thickness, and density of the interfacial dielectric, the gain of the bipolar transistor can be controlled.

Conversely, variation in composition, thickness, and density of the interfacial dielectric can result in unacceptable variation in values for the gain of the bipolar transistor. Variation in values for the gain can cause unpredictable performance, which makes circuit design difficult. Thus it is desirable to form the interfacial dielectric in a uniform manner so that composition, thickness, and density are consistent for devices on the same wafer, and are also consistent and repeatable from wafer to wafer.

For example, one method for forming interfacial silicon oxide uses a wet bench process which comprises flowing ozone in water across the wafer surface; the ozone reacts with the wafer surface to form oxide on the wafer surface.

Variation in gain from approximately 50.0 to 300.0 for devices on the same wafer using the wet bench process was found to be unacceptable. Efforts to improve the ozone distribution in the wet bench process to form a more uniform interfacial oxide have not provided the desired uniformity across the wafer or from wafer to wafer.

Another method for forming interfacial oxide is by controlling oxidation during the "drive-in" or "push-in" oxidation step of the doping process. Oxygen or water vapor is provided in the chamber used to heat the wafer for the "push-in" diffusion of dopants, and reaction of the oxygen with the wafer surface oxidizes the surface. However, heating of the wafer involved during "push-in" oxidation can contribute to unwanted device changes. For example, boron used to dope the silicon-germanium base of the HBT diffuses rapidly; excess diffusion of boron dopant slows the operation of the HBT. Thus, it is important in silicon-germanium processing to keep temperature transitions, the number of high temperature processing steps, and the time involved in each step to a minimum, i.e. the thermal budget must be minimized. Interfacial oxides formed during "push-in" oxidation have been too thick, resulting in values of gain in the HBT that are unacceptably high. Efforts to control interfacial oxide thickness during "push-in" oxidation have not provided the desired uniformity across the wafer or from wafer to wafer.

Another method for forming interfacial oxide is one involving rapid thermal processing ("RTP"). The method is described in "Single Wafer Rapid Thermal CVD for Poly-Emitter Bipolar and BiCMOS Devices" by Ahmed Kermani and Fred Wong in Solid State Technology, July 1990, at page 41. The article describes a reduced pressure, 900° C. temperature, rapid thermal oxidation technique to form an oxide layer. The high temperature of the technique invokes the concerns, discussed above, regarding thermal budget. In addition to excess boron diffusion, discussed above, the high 900° C. temperature can also damage the silicon-germanium crystal. The high temperature can cause strain relaxation in the strained silicon-germanium crystal layers, negating the benefits, for example, the increased speed, that the HBT derives from the strained silicon-germanium crystal layers.

There is thus a need in the art for forming an interfacial oxide which accurately controls the resulting gain of the bipolar transistor. There is also need in the art for forming an interfacial oxide of precise thickness and density. Further, there is a need in the art for fabricating an interfacial oxide which is uniform from die to die across each wafer and also uniform and repeatable from wafer to wafer. Moreover, there is need in the art for a method of fabricating an interfacial oxide which reduces or improves thermal budget.

SUMMARY OF THE INVENTION

The present invention is directed to method for fabricating interfacial oxide in a transistor and related structure. The invention overcomes the need in the art for forming an interfacial oxide which accurately controls the resulting gain of the transistor. The invention controls formation of interfacial oxide so that an interfacial oxide of precise thickness and density is formed. Further, the invention controls formation of interfacial oxide so that an interfacial oxide is formed which is uniform from die to die across each wafer and also uniform and repeatable from wafer to wafer. Moreover, the invention provides a method of fabricating an interfacial oxide which reduces or improves thermal budget.

According to the invention, a gas is supplied at a certain partial pressure for a chemical reaction with a top surface of a base in a transistor. The top surface of the base is heated to a certain temperature to promote the chemical reaction. For example, the gas can be oxygen, the base can be an epitaxial single crystal silicon-germanium base of a heterojunction bipolar transistor ("HBT"), and the chemical reaction can be oxidation of the silicon in the top surface of the silicon-germanium base. In one embodiment of the invention, the partial pressure of oxygen is maintained at 0.1 atmosphere and the top surface of the base is heated using rapid thermal processing ("RTP") to a temperature of 500° C.

The chemical reaction forms a dielectric layer on the top surface of the base by the chemical reaction of the gas with the top surface of the base, at the certain partial pressure and the certain temperature. For example, using oxygen as stated above, a dielectric layer of silicon oxide ("interfacial oxide") is formed. Controlling the thickness and density of the interfacial oxide causes the gain of the transistor to be as desired. For a silicon-germanium HBT, a gain of approximately 100.0 is desired. For example, using oxygen in the silicon-germanium HBT at 0.1 atmosphere partial pressure, and RTP to heat the top surface of the base of the HBT to 500 C., an interfacial oxide is formed with thickness approximately 9.0 to 13.0 Angstroms and area density in a range of approximately $1*10^{15}$ to $4*10^{15}$ atoms per square centimeter, which causes the gain of the HBT to be the desired value of approximately 100.0.

DETAILED DESCRIPTION OF THE INVENTION

The present invention is directed to method for fabricating interfacial oxide in a transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
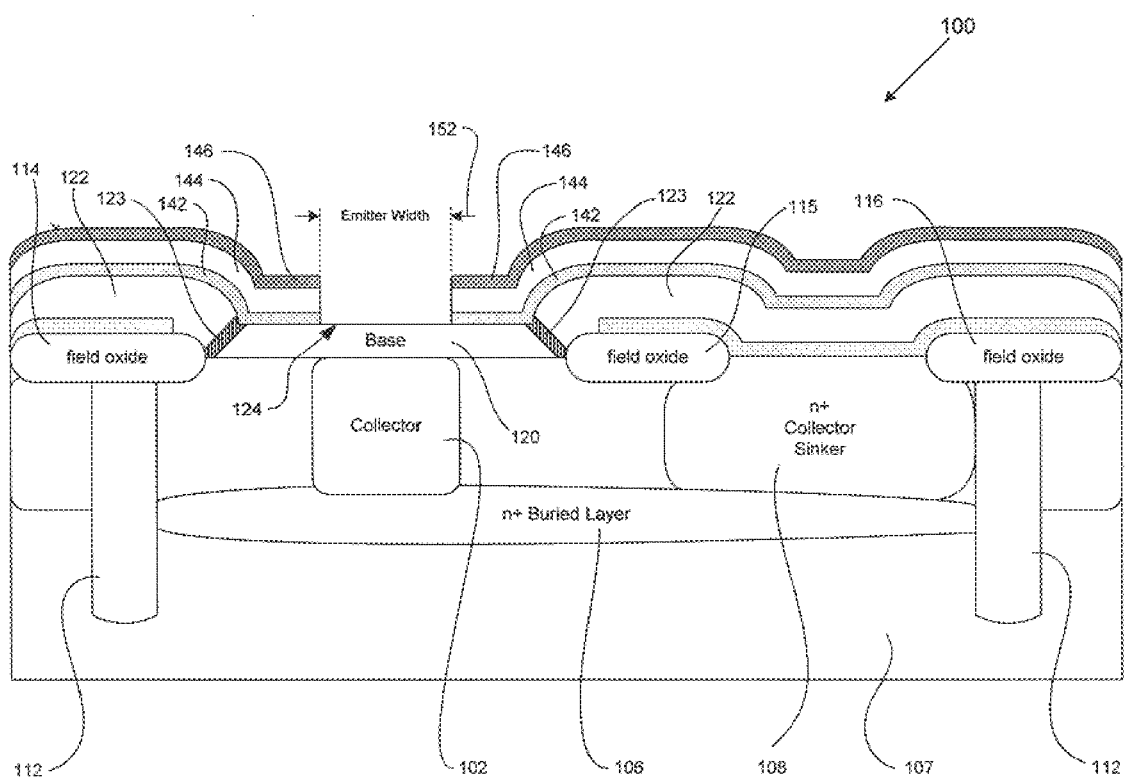
FIG. 1 illustrates a cross sectional view of some of the features of an NPN HBT prior to application of the steps taken to implement an embodiment of the present invention.

FIG. 1 shows exemplary structure 100, which is used to describe one embodiment of the present invention. Certain details and features have been left out of FIG. 1 which are apparent to a person of ordinary skill in the art. Structure 100 includes collector 102 and base 120 for a silicon-germanium heterojunction bipolar transistor ("HBT"). Collector 102 is N-type single crystal silicon, which can be formed using a dopant diffusion process in a manner known in the art. Base 120 is P-type silicon-germanium single crystal deposited epitaxially in a "nonselective" RPCVD process. As seen in FIG. 1, base 120 is situated on top of, and forms a junction with, collector 102. Base contact 122 is polycrystalline silicon-germanium deposited epitaxially in a "nonselective" RPCVD process. Base 120 and base contact 122 connect with each other at interface 123 between the contact polycrystalline material and the base single crystal material. Base 120 has a top surface 124.

In order to aid in formation of an emitter, etch stop layer 142, amorphous silicon layer 144, and antireflective coating ("ARC") 146 have been formed on top surface 124 of base 120 and over the top of base contact 122 as shown in FIG. 1. For example, etch stop layer 142 can be silicon oxide and ARC 146 can be a silicon oxynitride antireflective coating. A "window" has been opened in etch stop layer 142, amorphous silicon layer 144, and ARC 146 exposing a portion of top surface 124 of base 120. The width of the opening determines emitter width 152. Emitter width 152 is indicated in structure 100 by a pair of dashed lines and arrows and the words "emitter width." It is an object of one embodiment of the invention as described below to form an interfacial oxide on the exposed portion of top surface 124 of base 120. A polycrystalline silicon emitter is then formed on top of the interfacial oxide. By addition and formation of junctions and other structures in a manner known in the art, an NPN HBT is formed which includes collector 102 and base 120.

As seen in FIG. 1, buried layer 106, which is composed of N+ type material—meaning that it is relatively heavily doped N-type material—is formed in silicon substrate 107 in a manner known in the art. Collector sinker 108, also composed of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in any of the Figures). Deep trenches 112 and field oxide isolation regions 114, 115, and 116 composed of silicon oxide ($SiO_2$) material are formed in a manner known in the art. Deep trenches 112 and field oxide isolation regions 114, 115, and 116 provide electrical isolation from other devices on silicon substrate 107 in a manner known in the art. Thus FIG. 1 shows that structure 100 includes several features and components used to form an HBT at a stage prior to formation of an interfacial oxide above base 120 and addition of an emitter comprised of N-type polycrystalline silicon.

Figure 2:
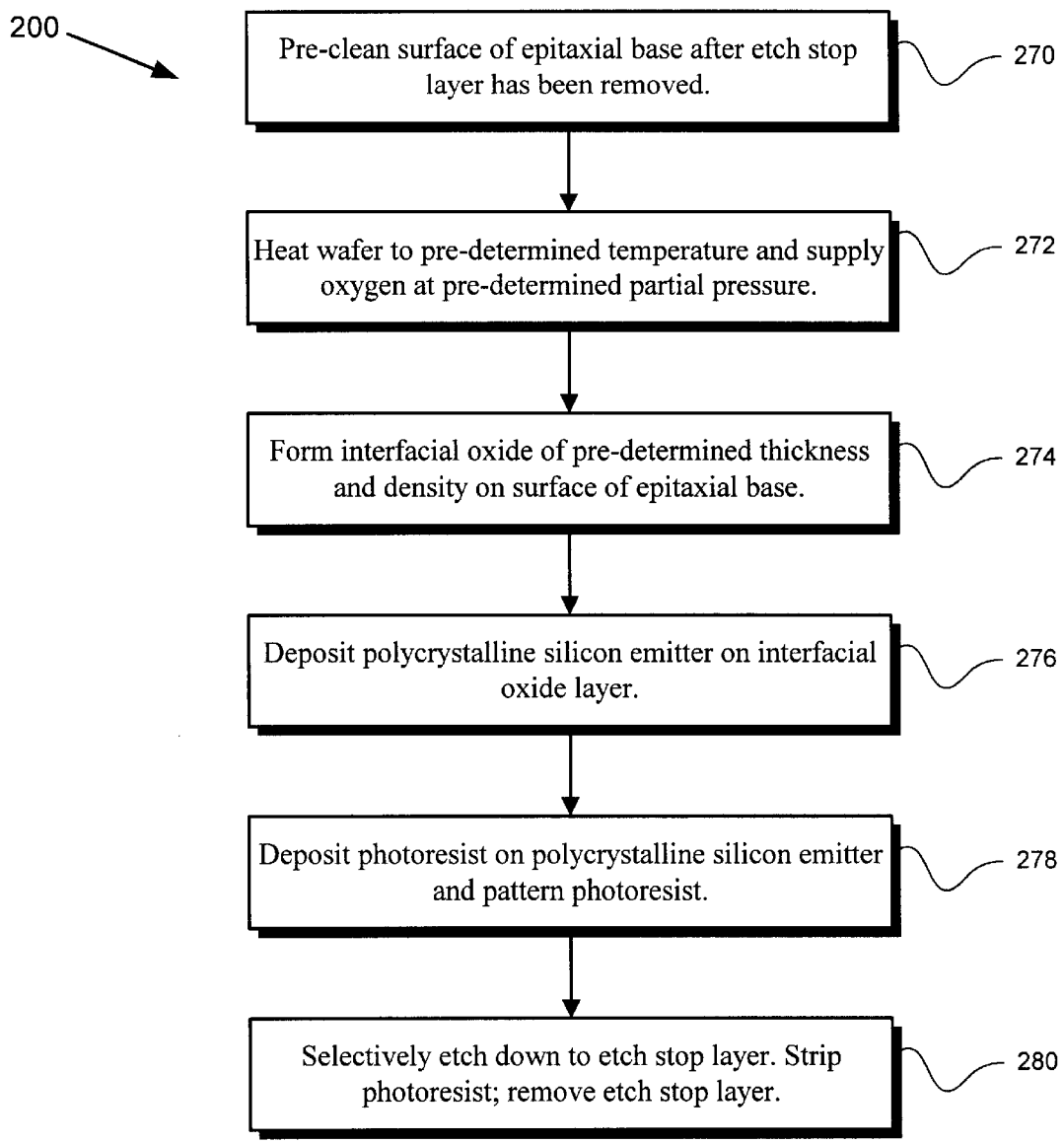
FIG. 2 shows a flowchart illustrating the steps taken to implement an embodiment of the present invention.

FIG. 2 shows flowchart 200, which describes the steps, according to one embodiment of the invention, in processing a wafer which includes structure 100 of FIG. 1. Certain details and features have been left out of flowchart 200 which are apparent to a person of ordinary skill in the art, for example, a step may consist of one or more substeps or may involve specialized equipment, as known in the art.

Steps 270 through 280 indicated in flowchart 200 are sufficient to describe one embodiment of the present invention, other embodiments of the invention may use steps different from those shown in flowchart 200. It is noted that the processing steps shown in flowchart 200 are performed on a wafer which, prior to step 270, includes structure 100 shown in FIG. 1. In particular the wafer includes top surface 124 of base 120 on which formation of an interfacial oxide is to take place prior to addition of an emitter comprised of N-type polycrystalline silicon.

Figure 3A:
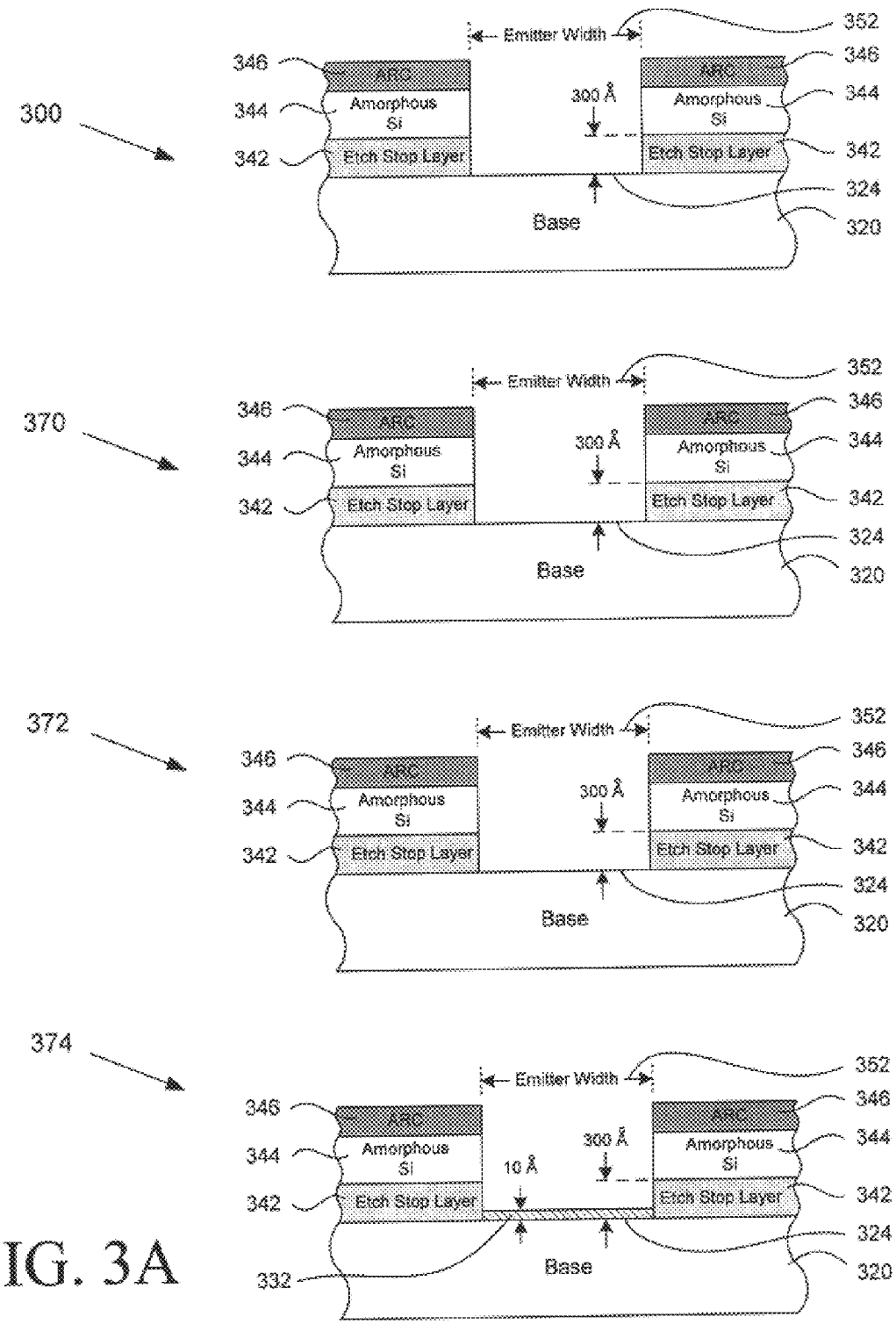
FIG. 3A illustrates cross sectional views, which include portions of a silicon wafer processed according to an embodiment of the invention, corresponding to certain steps of FIG. 2.

Referring now to FIG. 3A, structure 300 of FIG. 3A shows, in greater detail, a portion of structure 100 of FIG. 1. Base 120 and top surface 124 of base 120 of structure 100 are shown respectively in structure 300 as base 320 and top surface 324 of base 320. Etch stop layer 142, amorphous silicon layer 144, ARC 146, and emitter width 152 of structure 100 are shown respectively in structure 300 as etch stop layer 342, amorphous silicon layer 344, ARC 346, and emitter width 352. Etch stop layer 342 is also marked in structure 300 with the words "etch stop layer." Amorphous silicon layer 344 is also marked in structure 300 with the words "Amorphous Si" to indicate that it is composed of amorphous silicon. ARC 346 is also marked in structure 300 with the designation "ARC." Etch stop layer 342 is in a range of approximately 200.0 to 500.0 Angstroms thick.

By way of example, a nominal value of 300.0 Angstroms is indicated on structure 300 for the thickness of etch stop layer 342. However, it is manifest that the exact thickness of etch stop layer 342 can be modified without departing from the scope of the present invention. For simplicity, other features such as base contact 122, interface 123, collector 102, buried layer 106, silicon substrate 107, collector sinker 108, deep trenches 112, and field oxide isolation regions 114, 115, and 116 are not shown in structure 300. Structure 300 thus shows a portion of a wafer, including top surface 324 of base 320 on which an interfacial oxide is to be formed prior to addition of an emitter comprised of N-type polycrystalline silicon, before processing the wafer according to one embodiment of the invention as shown in flow chart 200. In particular, structure 300 shows a portion of the wafer before processing step 270 of flowchart 200.

Figure 3B:
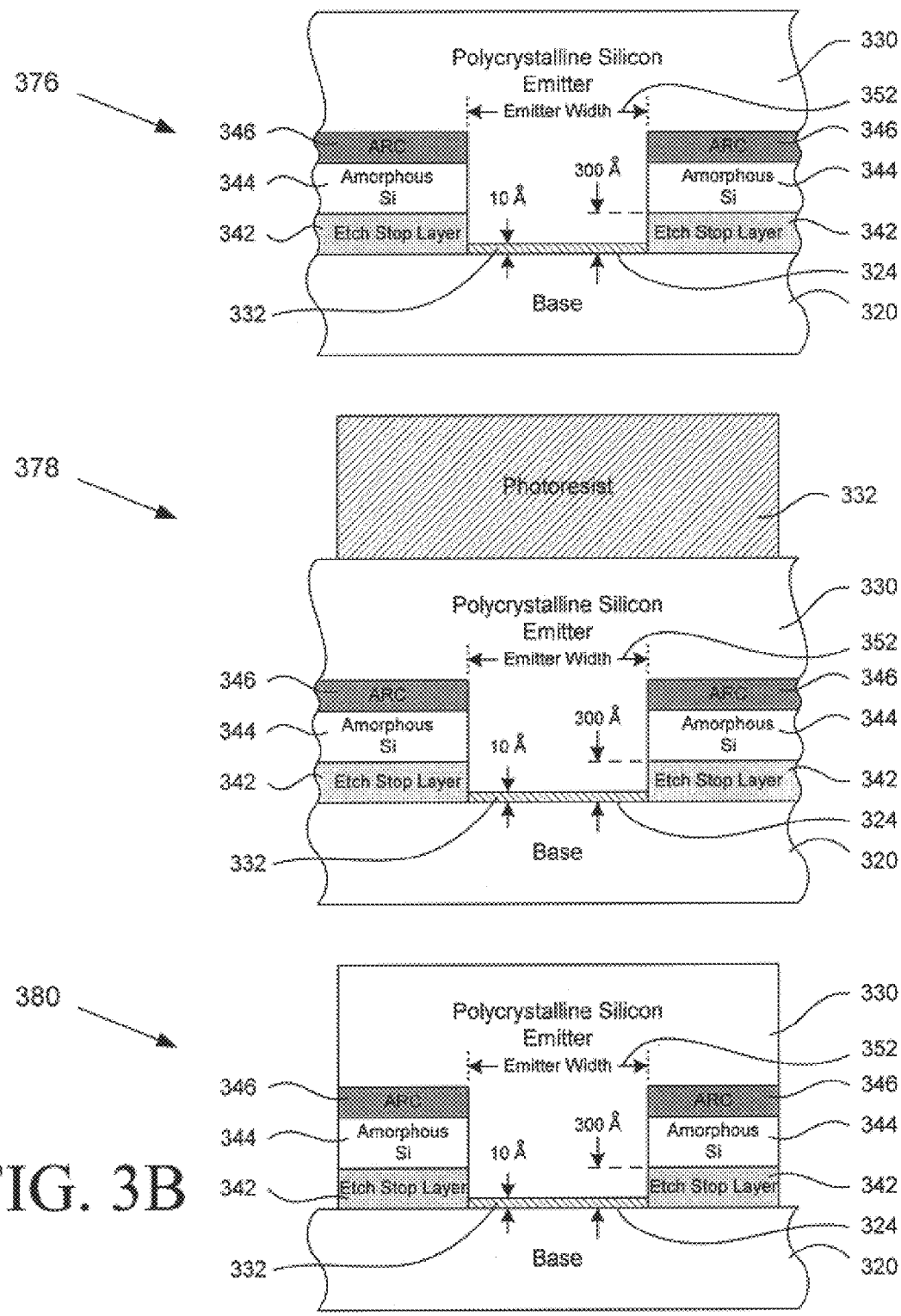
FIG. 3B illustrates cross sectional views, which include portions of a silicon wafer processed according to an embodiment of the invention, corresponding to certain steps of FIG. 2.

Referring to FIGS. 3A and 3B, each of structures 370, 372, 374, 376, 378, and 380 of FIGS. 3A and 3B illustrates the result of performing, on structure 300, steps 270, 272, 274, 276, 278, and 280, respectively, of flowchart 200 of FIG. 2. For example, structure 370 shows structure 300 after the processing of step 270; structure 372 shows structure 370 after the processing of step 272; and so forth.

Referring now to FIGS. 2 and 3A, step 270 of flowchart 200 comprises pre-cleaning top surface 324 of base 320, prior to forming an interfacial oxide on top surface 324 of base 320 and adding polycrystalline silicon to form an emitter 330. For example, the pre-clean can be a hydrogen fluoride clean. As another example, the pre-clean can be a hydrogen bake, i.e. heating the wafer in an atmosphere of hydrogen gas. The pre-clean is used to remove any residual contaminants from top surface 324 of base 320. Examples of contaminants include oxygen, water, and organo-metallic compounds. Referring to FIG. 3A, the result of step 270 of flow chart 200 is illustrated by structure 370. Structure 370 of FIG. 3A, then, shows structure 300 after pre-clean of top surface 324 of base 320 on which formation of an interfacial oxide is to take place prior to addition of an emitter comprised of N-type polycrystalline silicon.

Continuing with FIGS. 2 and 3A, step 272 of flowchart 200 comprises heating the wafer to a pre-determined temperature and supplying oxygen at a pre-determined partial pressure. For example, the wafer can be heated in a rapid thermal processing ("RTP") system, also referred to as a rapid thermal oxidation ("RTO") system. The predetermined temperature, for example, can be approximately 500° C. However, a temperature in the range of 300° C. to 650° C. can also be used. The oxygen can be supplied in an inert gas at a partial pressure, for example, of approximately 0.1 atmosphere. Generally, when a higher temperature is used, the oxygen partial pressure can be reduced; and conversely when a lower temperature is used, the oxygen partial pressure can be increased. Thus, the oxygen partial pressure can vary significantly from the 0.1 atmosphere which was given above as merely an example. Moreover, although oxygen ($O_2$) is discussed as a specific example in the present embodiment, other gases containing oxygen, such as $N_2O$, NO, or Ozone, can also be used in other embodiments of the present invention.

Referring to FIG. 3A, the result of step 272 of flowchart 200 is illustrated by structure 372. Structure 372 of FIG. 3A, then, shows structure 370, including top surface 324 of base 320 on which an interfacial oxide is to be formed prior to addition of an emitter comprised of N-type polycrystalline silicon, after RTP heating to pre-determined temperature and in a gas containing oxygen at a pre-determined partial pressure.

Continuing with FIGS. 2 and 3A, step 274 of flowchart 200 comprises forming interfacial oxide 332 on top surface 324 of base 320. The rapid thermal oxidation at the pre-determined temperature and partial pressure of oxygen causes formation of a layer of oxide of uniform thickness and density, comprising interfacial oxide 332, on top surface 324 of base 320. In one embodiment of the invention, the thickness of interfacial oxide 332 is in a range of approximately 9.0 to 13.0 Angstroms and the area density of interfacial oxide 332 is in a range of approximately $1*10^{15}$ to $4*10^{15}$ atoms per square centimeter.

It is essential to achieving the desired gain of the silicon-germanium HBT that the thickness and density of interfacial oxide 332 are uniform. Referring to FIG. 3A, the result of step 274 of flow chart 200 is illustrated by structure 374. By way of example, the thickness of interfacial oxide 332 is indicated on structure 374 by a nominal value of 10.0 Angstroms for comparison with the nominal value of 300.0 Angstroms indicated for the thickness of etch stop layer 342. However, it is manifest that the invention is not limited to these exact thicknesses. Structure 374 of FIG. 3A, then, shows structure 372, after formation of interfacial oxide 332 on top surface 324 of base 320.

Referring now to FIGS. 2 and 3B, step 276 of flowchart 200 comprises depositing polycrystalline silicon to form emitter 330. For example, the polycrystalline silicon can be deposited using RPCVD process. Emitter 330 can be doped with arsenic using an ion implantation process. The arsenic doping renders emitter 330 an N-type emitter. Referring to FIG. 3B, the result of step 276 of flow chart 200 is illustrated by structure 376. The result of step 276 is indicated in structure 376 by deposition of emitter 330 comprised of polycrystalline silicon. Structure 376 of FIG. 3B, then, shows structure 374 of FIG. 3A, including interfacial oxide 332 formed on top surface 324 of base 320, after deposition of polycrystalline silicon emitter 330 on interfacial oxide 332.

Continuing with FIGS. 2 and 3B, step 278 of flowchart 200 comprises depositing photoresist 332 on top of emitter 330 and patterning photoresist 332. Photoresist 332 is indicated in structure 378 with the word "photoresist." Photoresist 332 is patterned in a manner known in the art. While step 278 shows patterning using photoresist, other methods of patterning could be used, as understood by a person of ordinary skill in the art. Referring to FIG. 3B, the result of step 278 of flow chart 200 is illustrated by structure 378. Structure 378 of FIG. 3B, then, shows structure 376, including interfacial oxide 332 and polycrystalline silicon emitter 330, after the addition and patterning of photoresist 332.

Continuing with FIGS. 2 and 3B, step 280 of flowchart 200 comprises selectively etching emitter 330 of structure 378, stripping photoresist 332, and removing etch stop layer 342 from the surface of the wafer. The purpose of etching is to "trim" emitter 330, i.e., to localize the structure of emitter 330 to allow access to other features and components on the wafer which include, for example, the base contacts. The etching is done selectively, i.e. etchants are used which etch polycrystalline silicon emitter 330, silicon oxynitride ARC 346 and amorphous silicon layer 344 but do not substantially etch silicon dioxide etch stop layer 342. Suitable etchants with the desired properties are known in the art. For example, etchants that could be used include $CF_4$ and chlorine compounds known in the art. Referring to FIG. 3B, the result of selectively etching in step 280 of flow chart 200 is illustrated by structure 380. The result of selectively etching in step 280 is shown in structure 380 where emitter 330, ARC 346, and amorphous silicon layer 344 have a width corresponding to the patterning of photoresist 332.

Continuing with step 280 of flowchart 200, the purpose of stripping photoresist 332 is to prepare the wafer for further processing steps. Because photoresist 332 is no longer needed, it is stripped before further processing of the wafer. Although photoresist 332 has been used to etch polycrystalline silicon emitter 330, silicon oxynitride ARC 346 and amorphous silicon layer 344, it will be apparent to a person of ordinary skill in the art that other methods of etching polycrystalline silicon emitter 330, silicon oxynitride ARC 346 and amorphous silicon layer 344 according to a pattern could be used, and that, therefore, step 280 could be modified accordingly.

Continuing with step 280 of flowchart 200, silicon oxide etch stop layer 342 is removed from the surface of the wafer. The purpose of removing etch stop layer 342 is to allow access for further processing to other features and components on the wafer which include, for example, the base contacts. Removal of silicon oxide etch stop layer 342 can be accomplished, for example, using hydrogen fluoride. Referring to FIG. 3B, the result of step 280 of flow chart 200 is illustrated by structure 380. The result of step 280 is shown in structure 380 where emitter 330, ARC 346, amorphous silicon layer 344, and etch stop layer 342 have substantially uniform width. Etch stop layer 342 has been removed from the remainder of the wafer and photoresist 332 has been stripped. Structure 380 of FIG. 3B, then, shows structure 378 after formation of interfacial oxide 332 on top surface 324 of base 320, addition of emitter 330 comprised of polycrystalline silicon, stripping of photoresist 332, and removal of etch stop layer 342.

Figure 4:
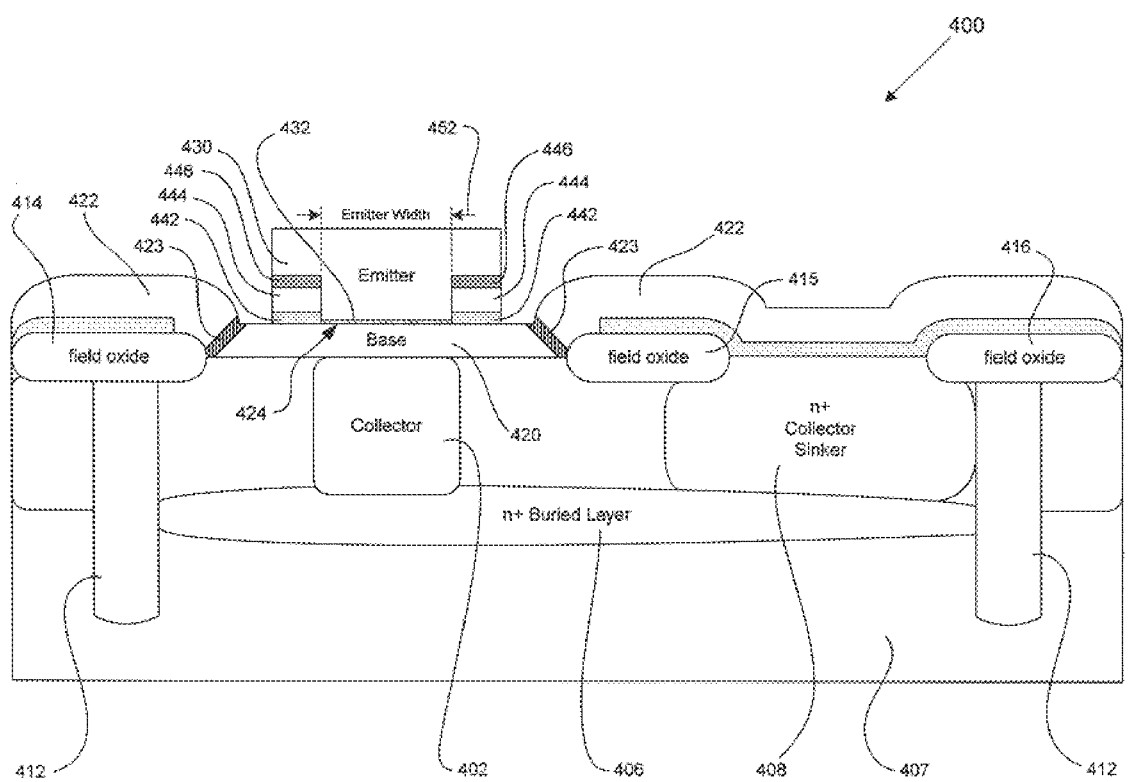
FIG. 4 illustrates a cross sectional view of some of the features of an NPN HBT fabricated in accordance with one embodiment of the present invention.

FIG. 4 shows structure 400, which illustrates structure 100 of FIG. 1 subsequent to step 280 of flow chart 200, more specifically after formation of emitter 330 comprised of N-type polycrystalline silicon and removal of etch stop layer 342. In particular, features and components 102, 104, 106, 107, 108, 112, 114, 115, 116, 120, 122, 123, 124, 142, 144, 146, and 152 of structure 100 of FIG. 1 are shown respectively as features and components 402, 404, 406, 407, 408, 412, 414, 415, 416, 420, 422, 423, 424, 442, 444, 446, and 452 of structure 400 of FIG. 4. In addition, emitter 330, and interfacial oxide 332 of structure 380 of FIG. 3B are shown respectively in structure 400 of FIG. 4 as emitter 430, and interfacial oxide 432. Thus, FIG. 4 shows structure 400 subsequent to step 280 of flow chart 200, after removal of etch stop layer 442, and after formation of interfacial oxide 432 on top surface 424 of base 420 and addition of mitter 430 comprised of N-type polycrystalline silicon.

FIG. 4 shows structure 400 after formation of interfacial oxide 432 and emitter 430 comprised of N-type polycrystalline silicon. By addition and formation of junctions and other structures, a silicon-germanium NPN HBT is formed which includes interfacial oxide 432 and emitter 430 of structure 400. Because of the control of thickness and density of interfacial oxide 432 achieved by one embodiment of the invention described here, the gain of the silicon-germanium HBT is predictable and is uniform from one device to another on the same wafer, as well as uniform and repeatable from one wafer to another.

For example, to cause a gain of approximately 100.0 for the silicon-germanium HBT, desirable area density for interfacial oxide 432 of approximately $1*10^{15}$ to $4*10^{15}$ atoms per square centimeter and desirable thickness for interfacial oxide 432 of approximately 9.0 to 13.0 Angstroms are achieved in one embodiment of the invention. In other embodiments of the invention, a gain of between approximately 400.0 to 1000.0 can be achieved by increasing the interfacial oxide thickness or by increasing the oxide area density. For example, the thickness of interfacial oxide 432 can be increased to a value between 13.0 and 25.0 Angstroms. On the other hand, in other embodiments of the invention, it is possible to achieve a gain below 100.0 by decreasing the thickness of the interfacial oxide or by lowering the oxide area density. For example, the thickness of interfacial oxide 432 can be decreased to a value between 3.0 and 9.0 Angstroms, or the area density of the oxide can be decreased to between $1*10^{13}$ and $1*10^{15}$.

The invention described here achieves control over the gain of the HBT by achieving control over the thickness and density of the interfacial oxide and providing uniform thickness and density of the resulting interfacial oxide. Control over the thickness and density during formation of the interfacial oxide is gained by controlling partial pressure of the chemical reactant used to form the interfacial oxide and by controlling temperature of the wafer during formation of the interfacial oxide. Oxygen is used as the chemical reactant in one embodiment of the invention described here, but other chemical reactants could be used, for example, $N_2O$ could be used to form an interfacial silicon oxynitride. Partial pressure of oxygen is maintained at 0.1 atmosphere, for example, in one embodiment of the invention described here. The low partial pressure enables the formation of oxide to proceed for a longer period of time, which provides more control over the formation of oxide. A single wafer RTP system can be used, for example, to provide good temperature uniformity across the wafer and repeatability of the same uniform temperature from wafer to wafer. The relatively higher temperatures used in RTP—approximately 500° C. as compared to the wet bench process discussed above where the typical temperature is approximately 60° C.—provide better temperature control and uniformity because the wafer has greater thermal stability, i.e. there is less relative temperature change, for example, at 500° C. than at 60° C. In other words, the temperature of the wafer is easier to control at higher temperatures than at very low temperatures.

Control of thickness and density of the interfacial dielectric is also gained by using temperatures lower than approximately 650° C. For example, one embodiment of the invention described here uses a temperature of approximately 500° C., as discussed above. The much higher temperatures of approximately 900° C., used by another method, form oxides more rapidly, and the resulting oxides are thicker, more dense, and less uniform. In addition, the higher temperature of approximately 900° C. used by other methods causes damage to the silicon-germanium HBT, as discussed above. Each heating of the wafer causes additional diffusion of dopants, especially boron. Heating the wafer can also cause strain relaxation in the silicon-germanium crystal as discussed above. Each cycle of heating and cooling the wafer can cause crystal dislocations in single crystal silicon and single crystal silicon-germanium. Thus, minimizing thermal budget avoids causing damage to the bipolar device on which the interfacial dielectric is being formed as well as other devices on the same wafer. Minimizing thermal budget is especially important in the fabrication of silicon-germanium semiconductor devices. Thus, an advantage of one embodiment of the invention described here is that it improves thermal budget by using lower temperature RTP.

It is appreciated by the above detailed disclosure that the invention provides a method for formation of an interfacial dielectric, in which thickness and density of the interfacial dielectric layer is accurately controlled, and which is uniform for devices on the same wafer and uniform and repeatable from wafer to wafer. In addition, one embodiment of the invention provides a low thermal budget method of forming oxide interfacial dielectric. Although the invention is described as applied to the construction of a heterojunction bipolar transistor, it will be readily apparent to a person of ordinary skill in the art how to apply the invention in similar situations where interfacial dielectric of accurate and uniform thickness and density is needed.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, silicon oxide interfacial dielectric can be replaced with silicon oxynitride interfacial dielectric without departing from the scope of the present invention. As another example, the base of the transistor, such as base 420 in structure 400, does not have to be a silicon-germanium base and in one embodiment of the invention, the base is a silicon-only base. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabricating interfacial oxide in a transistor and related structure have been described.

What is claimed is:

1. A method comprising steps of:

supplying a gas at a first partial pressure for a chemical reaction with a top surface of a base in a transistor;

heating said top surface of said base to a first temperature;

forming a dielectric layer on said top surface of said base by said chemical reaction of said gas at said first partial pressure and at said first temperature with said top surface of said base, wherein said first partial pressure and said first temperature determine a first thickness and a first density of said dielectric layer, wherein said first thickness and said first density of said dielectric layer determine a gain of said transistor.

2. The method of claim 1 wherein said base comprises single crystal silicon-germanium.

3. The method of claim 1 wherein said base comprises single crystal silicon.

4. The method of claim 1 wherein said transistor further comprises a collector forming a junction with said base.

5. The method of claim 4 wherein said transistor further comprises an emitter forming a junction with said base.

6. The method of claim 5 wherein said emitter comprises polycrystalline silicon.

7. The method of claim 5 wherein said base comprises single crystal silicon-germanium, said collector comprises single crystal silicon, and said emitter comprises polycrystalline silicon.

8. The method of claim 7 wherein said transistor has a gain of approximately 100.

9. The method of claim 7 wherein said first thickness and said first density of said dielectric layer cause said gain of said transistor to be between approximately 400 and approximately 1000.

10. The method of claim 4 wherein said collector comprises single crystal silicon.

11. The method of claim 1 wherein said first thickness and said first density of said dielectric layer cause said gain of said transistor to be approximately 100.

12. The method of claim 1 wherein said first thickness and said first density of said dielectric layer cause said gain of said transistor to be between approximately 400 and approximately 1000.

13. The method of claim 1 wherein said dielectric layer comprises silicon oxide.

14. The method of claim 1 wherein said first thickness of said dielectric layer is between approximately 9.0 and approximately 13.0 Angstroms.

15. The method of claim 1 wherein said first thickness of said dielectric layer is between approximately 3.0 and approximately 9.0 Angstroms.

16. The method of claim 1 wherein said first thickness of said dielectric layer is between approximately 13.0 and approximately 25.0 Angstroms.

17. The method of claim 1 wherein said first density of said dielectric layer is between approximately $1*10^{15}$ and approximately $4*10^{15}$ atoms per square centimeter.

18. The method of claim 1 wherein said first density of said dielectric layer is between approximately $1*10^{13}$ and approximately $1*10^{15}$ atoms per square centimeter.

19. The method of claim 1 wherein said base comprises single crystal silicon.

20. The method of claim 1 wherein said supplying step comprises supplying oxygen at a partial pressure of approximately 0.1 atmosphere.

21. The method of claim 1 wherein said heating step comprises heating said top surface of said base to a temperature of approximately 500° C.

22. The method of claim 1 wherein said heating step comprises heating said top surface of said base to a temperature of between approximately 300° C. and approximately 650° C.

23. The method of claim 1 wherein said supplying step comprises supplying oxygen, and wherein said heating step comprises heating said top surface of said base to a temperature of between approximately 300° C. and approximately 650° C.

24. The method of claim 1 wherein said gas in said supplying step is selected from the group consisting of $N_2O$, NO, and Ozone.

25. A method comprising steps of:

supplying a gas at a first partial pressure for a chemical reaction with a top surface of a base in a transistor;

heating said top surface of said base to a first temperature;

forming a dielectric layer on said top surface of said base by said chemical reaction of said gas at said first partial pressure and at said first temperature with said top surface of said base, wherein a first thickness and a first density of said dielectric layer determines a gain of said transistor, wherein said gain of said transistor is between approximately 100 and approximately 1000.

26. A method comprising steps of:

supplying a gas at a first partial pressure for a chemical reaction with a top surface of a base in a transistor;

heating said top surface of said base to a first temperature;

forming a dielectric layer on said top surface of said base by said chemical reaction of said gas at said first partial pressure and at said first temperature with said top surface of said base, wherein a first thickness and a first density of said dielectric layer determines a gain of said transistor, wherein said first thickness of said dielectric layer is between approximately 3.0 and approximately 25.0 Angstroms.

27. A method comprising steps of:

supplying a gas at a first partial pressure for a chemical reaction with a top surface of a base in a transistor;

heating said top surface of said base to a first temperature;

forming a dielectric layer on said top surface of said base by said chemical reaction of said gas at said first partial pressure and at said first temperature with said top surface of said base, wherein a first thickness and a first density of said dielectric layer determines a gain of said transistor, wherein said first density of said dielectric layer is between approximately $1*10^{13}$ and approximately $4*10^{15}$ atoms per square centimeter.

28. A method comprising steps of:

supplying a gas at a first partial pressure for a chemical reaction with a top surface of a base in a transistor, wherein said first partial pressure is approximately 0.1 atmosphere;

heating said top surface of said base to a first temperature;

forming a dielectric layer on said top surface of said base by said chemical reaction of said gas at said first partial pressure and at said first temperature with said top surface of said base, wherein a first thickness and a first density of said dielectric layer determines a gain of said transistor.

29. A method comprising steps of:

supplying a gas at a first partial pressure for a chemical reaction with a top surface of a base in a transistor, said gas being selected from the group consisting of $N_2O$, NO, and Ozone;

heating said top surface of said base to a first temperature;

forming a dielectric layer on said top surface of said base by said chemical reaction of said gas at said first partial pressure and at said first temperature with said top surface of said base, wherein a first thickness and a first density of said dielectric layer determines a gain of said transistor.

* * * * *